United States Patent

Tsubouchi et al.

[11] Patent Number: 6,154,957
[45] Date of Patent: Dec. 5, 2000

[54] METHOD OF AND APPARATUS FOR MOUNTING ELECTRONIC PARTS

[75] Inventors: Yuzo Tsubouchi, Onojo; Nobutaka Abe, Dazaifu; Yuji Nakamura, Kurume, all of Japan

[73] Assignee: Matsushita Electric Industrial Co., Ltd., Osaka, Japan

[21] Appl. No.: 08/938,974

[22] Filed: Sep. 26, 1997

[30] Foreign Application Priority Data

Oct. 11, 1996 [JP] Japan ..................... 8-269585

[51] Int. Cl.⁷ .................... H05K 3/30; B23P 19/00
[52] U.S. Cl. .................. 29/836; 29/709; 29/710; 29/740; 29/743; 29/834; 364/468.15; 364/468.28
[58] Field of Search .................... 29/701, 706, 709, 29/710, 740, 743, 593, 834, 836; 364/468.15, 468.21, 468.28, 478.01

[56] References Cited

U.S. PATENT DOCUMENTS

| | | | |
|---|---|---|---|
| 4,593,462 | 6/1986 | Yagi et al. | 29/740 |
| 4,858,308 | 8/1989 | Komori | 29/740 |
| 4,980,970 | 1/1991 | Uchida et al. | 29/833 |
| 5,088,187 | 2/1992 | Takata et al. | 29/740 |
| 5,212,881 | 5/1993 | Nishitsuka et al. | 29/740 |
| 5,377,405 | 1/1995 | Sakurai et al. | 29/833 |
| 5,475,619 | 12/1995 | Sugano et al. | 364/558 |
| 5,608,642 | 3/1997 | Onodera | 364/478.01 |
| 5,761,798 | 6/1998 | Suzuki | 29/832 |
| 5,794,329 | 8/1998 | Rossmeisl et al. | 29/743 |
| 5,840,594 | 11/1998 | Tsubouchi et al. | 438/15 |
| 5,864,944 | 2/1999 | Kashiwagi et al. | 29/740 |
| 5,884,831 | 3/1999 | Sato et al. | 228/6.2 |
| 5,911,456 | 6/1999 | Tsubouchi et al. | 29/743 |

FOREIGN PATENT DOCUMENTS 370920   11/1991   Japan .

*Primary Examiner*—Lee Young
*Assistant Examiner*—A. Dexter Tugbang
*Attorney, Agent, or Firm*—Stevens, Davis, Miller & Mosher, L.L.P.

[57] ABSTRACT

An electronic parts mounting method in which chips in a plurality of parts feeders are picked up respectively by at least three nozzles, and a lowered mounting efficiency is avoided when any of the nozzles becomes bad, thereby mounting the chips on a board with a good operation efficiency. In a normal condition, the chips in the parts feeders are simultaneously picked up respectively by the first, second and third nozzles, and are transferred to and mounted on the board. When any of the three nozzles becomes bad, the mounting of the chips by this bad nozzle is stopped while the mounting of the chips by the other normal nozzles is effected as scheduled in a program, and thereafter those chips scheduled to be mounted by the bad nozzle are mounted by the normal nozzles. Therefore, the number of the pick-up operations is reduced as much as possible, so that the mounting efficiency can be enhanced.

12 Claims, 5 Drawing Sheets

OPERATION IN NORMAL CONDITION

| FREQUENCY OF MOVEMENTS | 1ST | 2ND | 3RD | 4TH |
|---|---|---|---|---|
| 1ST NOZZLE 9a | A | D | D | B |
| 2ND NOZZLE 9b | B | E | E | E |
| 3RD NOZZLE 9c | C | F | F | G |
| PICK-UP OPERATION | SIMULTA-NEOUS | SIMULTA-NEOUS | SIMULTA-NEOUS | SEPA-RATE |

OPERATION WHEN BAD NOZZLE IS PRODUCED (NO. 1)

| FREQUENCY OF MOVEMENTS | 1ST | 2ND | 3RD | 4TH | 5TH | 6TH |
|---|---|---|---|---|---|---|
| 1ST NOZZLE 9a | A | D | D | B | B | E |
| 2ND NOZZLE 9b | B̶ | E̶ | E̶ | E̶ | | |
| 3RD NOZZLE 9c | C | F | F | G | E | E |
| PICK-UP OPERATION | SIMULTA-NEOUS | SIMULTA-NEOUS | SIMULTA-NEOUS | SEPA-RATE | SEPA-RATE | SEPA-RATE |

OPERATION WHEN BAD NOZZLE IS PRODUCED (NO. 2)

| FREQUENCY OF MOVEMENTS | 1ST | 2ND | 3RD | 4TH | 5TH | 6TH |
|---|---|---|---|---|---|---|
| 1ST NOZZLE 9a | A | C | E | D | F | E |
| 2ND NOZZLE 9b | B̶ | E̶ | E̶ | E̶ | | |
| 3RD NOZZLE 9c | B | D | F | E | B | G |
| PICK-UP OPERATION | SEPA-RATE | SEPA-RATE | SEPA-RATE | SEPA-RATE | SEPA-RATE | SEPA-RATE |

| SEQUENCE NO. | PARTS |
|---|---|
| 1 | A |
| 2 | B |
| 3 | C |
| 4 | D |
| 5 | E |
| 6 | F |
| 7 | D |
| 8 | E |
| 9 | F |
| 10 | B |
| 11 | E |
| 12 | G |

FIG. 6  OPERATION IN NORMAL CONDITION

| FREQUENCY OF MOVEMENTS | 1ST | 2ND | 3RD | 4TH |
|---|---|---|---|---|
| 1ST NOZZLE 9a | A | D | D | B |
| 2ND NOZZLE 9b | B | E | E | E |
| 3RD NOZZLE 9c | C | F | F | G |
| PICK-UP OPERATION | SIMULTANEOUS | SIMULTANEOUS | SIMULTANEOUS | SEPARATE |

FIG. 7  OPERATION WHEN BAD NOZZLE IS PRODUCED (NO. 1)

| FREQUENCY OF MOVEMENTS | 1ST | 2ND | 3RD | 4TH | 5TH | 6TH |
|---|---|---|---|---|---|---|
| 1ST NOZZLE 9a | A | D | D | B | B | E |
| 2ND NOZZLE 9b | ~~B~~ | ~~E~~ | ~~E~~ | ~~E~~ | | |
| 3RD NOZZLE 9c | C | F | F | G | E | E |
| PICK-UP OPERATION | SIMULTANEOUS | SIMULTANEOUS | SIMULTANEOUS | SEPARATE | SEPARATE | SEPARATE |

FIG. 8  OPERATION WHEN BAD NOZZLE IS PRODUCED (NO. 2)

| FREQUENCY OF MOVEMENTS | 1ST | 2ND | 3RD | 4TH | 5TH | 6TH |
|---|---|---|---|---|---|---|
| 1ST NOZZLE 9a | A | C | E | D | F | E |
| 2ND NOZZLE 9b | ~~B~~ | ~~E~~ | ~~E~~ | ~~E~~ | | |
| 3RD NOZZLE 9c | B | D | F | E | B | G |
| PICK-UP OPERATION | SEPARATE | SEPARATE | SEPARATE | SEPARATE | SEPARATE | SEPARATE |

METHOD OF AND APPARATUS FOR MOUNTING ELECTRONIC PARTS

BACKGROUND OF THE INVENTION

1. Field of the Invention

This invention relates to an electronic parts mounting method in which electronic parts in parts feeders are picked up by a plurality of nozzles mounted on a transfer head, and are transferred to and mounted on a board.

2. Related Art

There has been extensively used the type of electronic parts mounting apparatus for transferring and mounting electronic parts (hereinafter referred to as "chips") on a board, in which while horizontally moving a transfer head in an X-direction and a Y-direction by a moving table, a chip, stored in a parts feeder is held by vacuum suction at a lower end of a nozzle on the transfer head, and is picked up, thereby transferring and mounting at a predetermined coordinate position on the board.

There has been proposed another electronic parts mounting apparatus of this type (Japanese Patent Publication No. 3-70920) in which chips stored respectively in a plurality of parts feeders juxtaposed at a pitch are simultaneously picked up by vacuum suction respectively by not less than three nozzles mounted in a row at a pitch on a transfer head, and are transferred to and mounted on a board. This method has an advantage that a mounting efficiency is greatly enhanced since the plurality of electronic parts are simultaneously picked up at a time by not less than three nozzles.

However, a bad nozzle is liable to be produced among the nozzles on the transfer head. The term "bad nozzle" means a defective nozzle which can not properly hold the chip by vacuum suction, for example, because the nozzle is clogged or bent. Heretofore, when such a bad nozzle was produced, the use of this bad nozzle was stopped, and the chips were transferred to and mounted on the board, using only the remaining normal (proper) nozzles.

However, heretofore, when the bad nozzle was produced, predetermined programs were all changed, and all of the chips were separately picked up by the remaining normal nozzles, and were transferred to and mounted on the board. Therefore, the frequency of the pick-up operations, as well as the frequency of reciprocal movements of the transfer head between the parts feeder and the board, became much larger than that predetermined in a program, so that the mounting efficiency became poor, thus inviting a problem that the advantage of the transfer head with the plurality of nozzles could not be enjoyed.

SUMMARY OF THE INVENTION

It is therefore an object of this invention to provide an electronic parts mounting method which is performed by an electronic parts mounting apparatus in which chips in a plurality of parts feeders are picked up respectively by not less than three nozzles, in which method a lowered mounting efficiency is avoided when any of the nozzles becomes bad, thereby mounting the chips on a board with a good operation efficiency.

In an electronic parts mounting method of the present invention, when any of at least three nozzles becomes bad, the mounting of electronic parts by this bad nozzle is stopped while the mounting of the electronic parts by the other normal nozzles is effected as scheduled in a program, and those electronic parts scheduled to be mounted by the bad nozzle are mounted by the normal nozzles.

In the above construction of the present invention, when a bad nozzle is produced, the plurality of chips are picked up by the remaining normal nozzles, and are mounted on the board as scheduled, and those chips scheduled to be mounted by the bad nozzle are mounted by the normal nozzles. Therefore, the increase of the number of the pick-up operations, as well as the increase of the number of reciprocal movement of the transfer head between the parts feeder and the board, is suppressed as much as possible, and the chips can be efficiently mounted on the board while enjoying the advantage of the transfer head having the plurality of the nozzles.

BRIEF DESCRIPTION OF THE DRAWINGS

FIG. 6 is a diagram explanatory of a chip pick-up method in a normal condition of the electronic parts mounting apparatus;

FIG. 7 is a diagram explanatory of a chip pick-up method at a time when a bad nozzle is produced in the electronic parts mounting apparatus; and FIG. 8 is a diagram explanatory of another chip pick-up method at a time when a bad nozzle is produced in the electronic parts mounting apparatus.

DESCRIPTION OF THE PREFERRED EMBODIMENT

Figure 1:
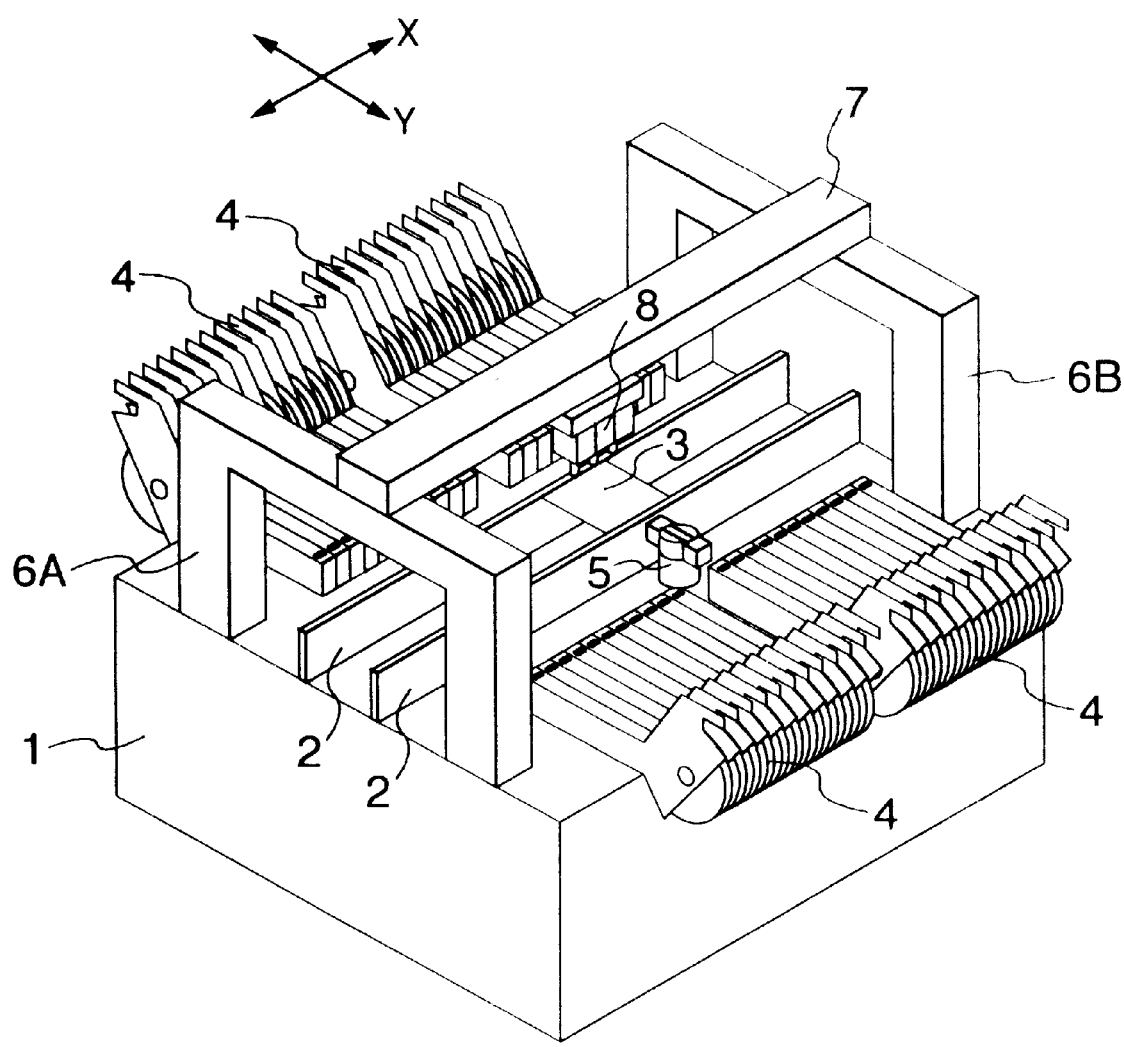
FIG. 1 is a perspective view of one preferred embodiment of an electronic parts mounting apparatus of the present invention.

One preferred embodiment of the present invention will now be described with reference to the drawings. FIG. 1 is a perspective view of one preferred embodiment of an electronic parts mounting apparatus of the present invention, FIG. 2 is a front-elevational view of the apparatus, FIG. 3 is a block diagram of a control system of the apparatus, FIG. 4 is a front-elevational view showing nozzles and parts feeders in the apparatus, FIG. 5 is a sequential diagram of the apparatus, FIG. 6 is a diagram explanatory of a chip pick-up method in a normal condition of the apparatus, FIG. 7 is a diagram explanatory of a chip pick-up method at a time when a bad nozzle is produced in the apparatus, and FIG. 8 is a diagram explanatory of another chip pick-up method at a time when a bad nozzle is produced in the apparatus.

Figure 2:
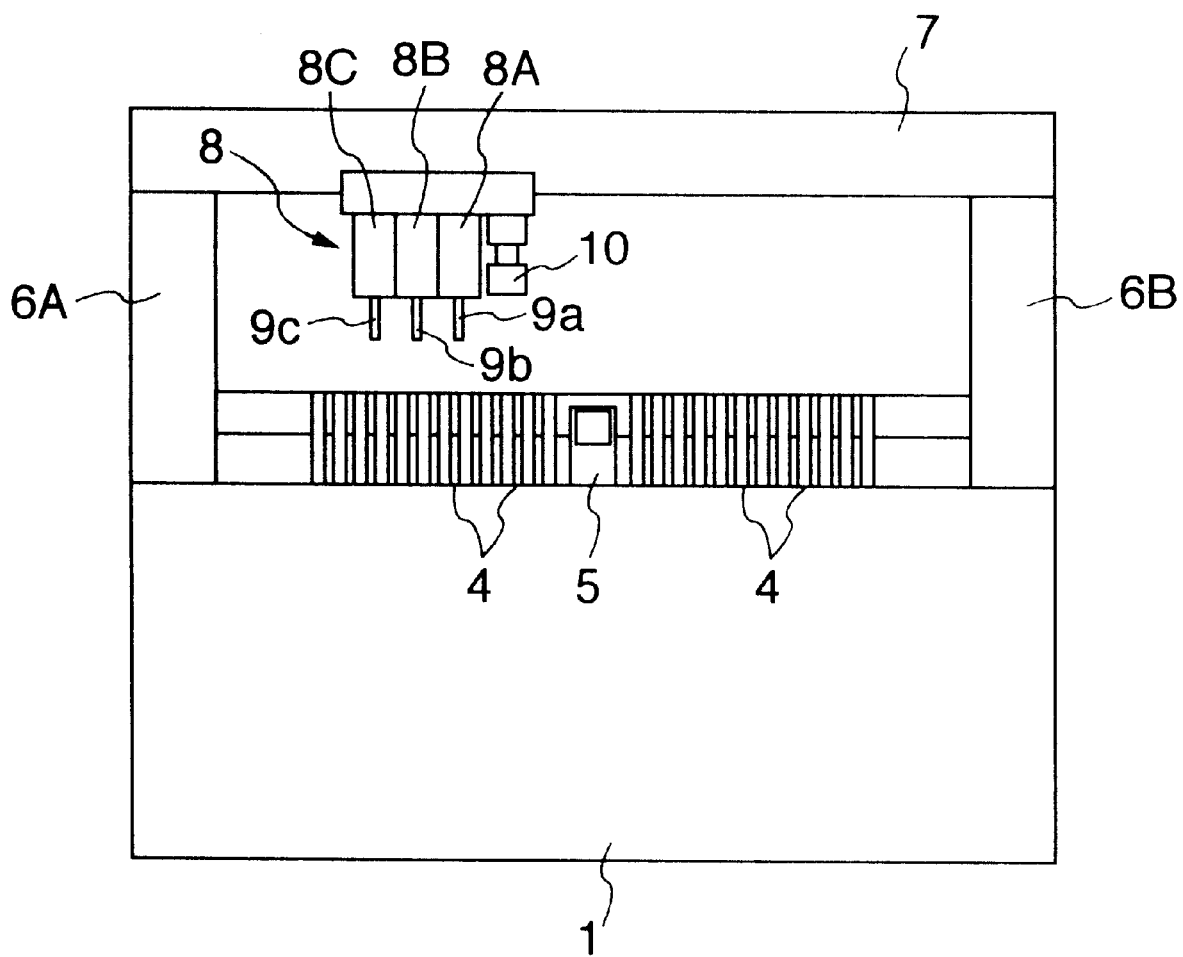
FIG. 2 is a front-elevational view of the electronic parts mounting apparatus.

Referring to FIGS. 1 and 2, the overall construction of the electronic parts mounting apparatus will first be described. Two guide rails 2 are mounted on an upper surface of a bed 1 intermediate front and rear sides thereof. A board 3 is conveyed along the guide rails 2, and is positioned at a predetermined position by the guide rails 2. Namely, the guide rails 2 serve as a positioning portion for positioning the board 3. A number of parts feeders 4 are juxtaposed in a row on the outer side of each of the guide rails 2. Various kinds of chips (electronic parts) are stored in the parts feeders 4. A first camera 5 is provided between the guide rail 2 and the parts feeders 4. The first camera 5 observes nozzles on a transfer head so as to detect the positions of these nozzles.

In FIG. 1, Y-tables 6A and 6B are mounted respectively on opposite side portions of the bed 1, and an X-table 7 is mounted on and extends between the Y-tables 6A and 6B. A transfer head 8 is mounted on the X-table 7. The transfer head 8 comprises a plurality of (three in this embodiment) heads (a first head 8A, a second head 8B and a third head 8C) juxtaposed in a row, and the three heads have a first nozzle 9a, a second nozzle 9b and a third nozzle 9c, respectively. Although not shown in the drawings, a suction-holding member in each of the nozzles 9a, 9b and 9c can be exchanged depending on the size, etc., of the parts. A second camera 10 is fixedly mounted on the transfer head 8 (FIG. 2). The Y-tables 6A and 6B and the X-table 7 serve as tables for horizontally moving the transfer head 8 in an X-direction and a Y-direction. The second camera 10 horizontally moves in unison with the transfer head 8 and observes the chips stored in the parts feeders 4 so as to detect pick-up positions for the chips. In the present invention, the direction of conveyance of the board 3 along the guide rails 2 is the X-direction.

Figure 3:
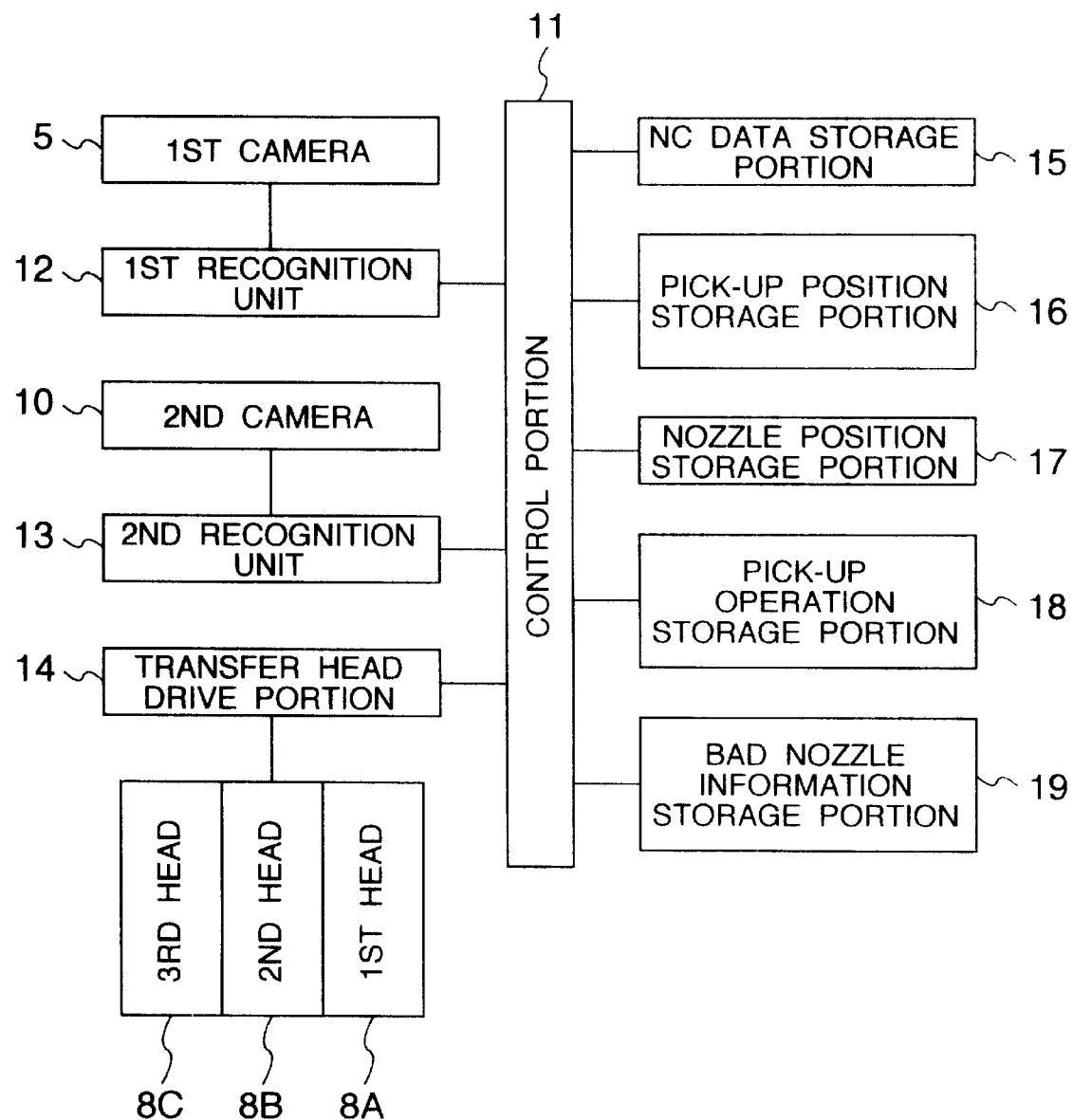
FIG. 3 is a block diagram of a control system of the electronic parts mounting apparatus.
Figures 4, 5:
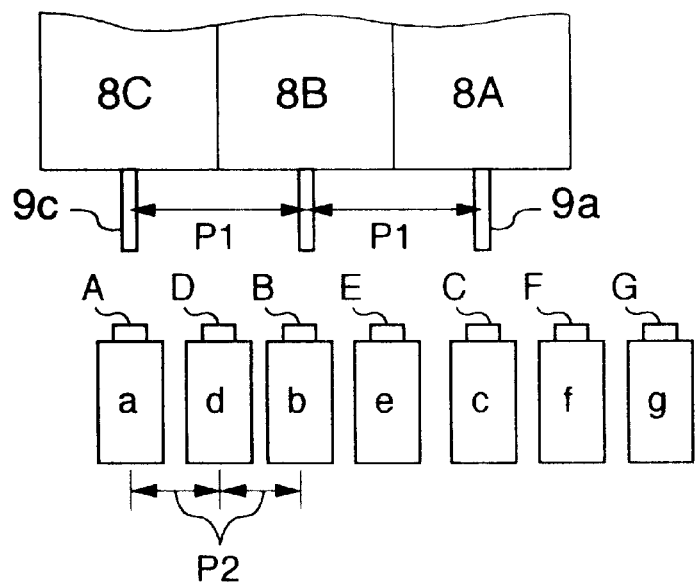
FIG. 4 is a front-elevational view showing nozzles and parts feeders in the electronic parts mounting apparatus.
FIG. 5 is a sequential diagram of the electronic parts mounting apparatus.

In FIG. 3, reference numeral 11 denotes a control portion, and the following elements are connected to this control portion 11. A first recognition unit 12 is connected to the first camera 5. The first recognition unit 12 processes image data of the nozzles and chips picked up by the first camera 5. In accordance with these data, the control portion 11 finds the positions of the nozzles and chips through calculation or computation. A second recognition unit 13 is connected to the second camera 10. The second recognition unit 13 processes image data of a position mark of the board and image data of the chips at the pick-up positions of the parts feeders 4, which data are picked up by the second camera 10. In accordance with these data, the control portion 11 finds the position of the board 3 and the pick-up positions through calculation. A transfer head drive portion 14 is connected to the first head 8A, the second head 8B and the third head 8C. The transfer head drive portion 14 moves the first nozzle 9a, the second nozzle 9b and the third nozzle 9c upward and downward.

Program data, including data related to the order of mounting of the chips and the positions of mounting of the chips, are stored in a NC data storage portion 15. A pick-up position storage portion 16 stores the positions of picking-up of the chips in the parts feeders 4. A nozzle position storage portion 17 stores the positions of the first, second and third nozzles 9a, 9b and 9c detected by the first camera 5. A pick-up operation storage portion 18 stores data as to whether or not the chips are simultaneously picked up respectively by the three nozzles 9a to 9c. A bad nozzle information storage portion 19 stores bad nozzles. The control portion 11 effects other various calculations and judgments, and controls the various elements.

This electronic parts mounting apparatus has the above construction, and the operation thereof will now be described. In FIG. 4, reference characters A to G respectively denote the electronic parts stored respectively in the parts feeders 4a to 4g. In FIG. 4, in order to distinguish a number of parts feeders 4 from one another, suffixes a to g are added to reference numeral 4. In this embodiment, the pitch P1 of the three nozzles 9a to 9c is twice larger than the pitch P2 of the parts feeders 4a to 4g, and with this arrangement the three nozzles 9a to 9c can simultaneously pick up the chips, stored in the alternate parts feeders, respectively. Thus, the pitch P1 of the nozzles 9a to 9c is an integral multiple of the pitch P2 of the parts feeders 4a to 4g so that the plurality of nozzles 9a to 9c can simultaneously pick up the chips in the parts feeders 4, respectively. FIG. 5 is the sequential diagram, and the parts A to G are mounted on the board 3 in the order shown in this Figure.

FIG. 6 shows the pick-up method in a normal condition. The frequency of movements is the number of reciprocal movements of the nozzles 9a, 9b and 9c between the parts feeder 4 and the board 3. In the normal condition, in the 1st mounting operation, three chips A, B and C of Sequence Nos. 1, 2 and 3 are simultaneously picked up respectively by the three nozzles 9a, 9b and 9c, and are transferred to and mounted on the board 3. Similarly, in the 2nd mounting operation, three chips D, E and F of Sequence Nos. 4, 5 and 6 are simultaneously picked up, and are transferred to and mounted on the board 3, and in the 3rd mounting operation, three chips D, E and F of Sequence Nos. 7, 8 and 9 are simultaneously picked up, and are transferred to and mounted on the board 3. In this manner, 9 chips of Sequence Nos. 1 to 9 are mounted on the board 3 by the three mounting operations.

Three chips B, E and G of Sequence Nos. 10 to 12 can not be simultaneously picked up respectively by the three nozzles 9a to 9c since the pitch of these chips B, E and G is different from the pitch P1 of the nozzles 9a to 9c, as is clear from FIG. 4. Therefore, these chips B, E and G are not simultaneously picked up respectively by the three nozzles 9a to 9c, but are separately picked up respectively by these nozzles 9a to 9c, and are separately transferred to and mounted on the board 3. To pick up the chips separately as described above for the chips of Sequence Nos. 10 to 12, instead of simultaneously picking up the plurality of chips respectively by the plurality of nozzles as described above for the chips of Sequence Nos. 1 to 9, is referred to as "separate picking-up" in the present invention. As described above, in the normal condition, 12 chips of Sequence Nos. 1 to 12 can be picked up by 6 pick-up operations (3 simultaneous pick-up operations plus 3 separate pick-up operations), and can be mounted on the board 3.

Next, a pick-up method, performed when a bad nozzle is produced, will be described with reference to FIG. 7. The bad nozzle is a defective nozzle which can not pick up the chip for some reason as described above. A common method of detecting such a bad nozzle is to detect the nozzle which frequently makes pick-up mistakes and to decide that this nozzle is a bad nozzle. For example, in one pick-up mistake detection method, the lower end of each nozzle is observed by the first camera 5 so as to determine whether or not the chip is held by suction at the lower end of the nozzle, and if any chip is not held by suction, it is judged that a pick-up mistake is encountered. In another pick-up mistake detection method, an internal pressure of each nozzle is measured by a pressure sensor (in this case, if the chip is held by suction at the lower end of the nozzle, the internal pressure of the nozzle is a negative pressure less than a threshold value, and if any chip is not held by suction, the internal pressure of the nozzle fails to become a negative pressure less than the threshold value). When the same nozzle consecutively makes pick-up mistakes, so that the number of mistakes reaches a predetermined value, or when the rate of pick-up mistake reaches a predetermined value, it is judged that this nozzle is a bad nozzle. Whether or not the nozzle is a bad nozzle is judged by the control portion 11, and data of the bad nozzle is stored in the bad nozzle information storage portion 19.

FIG. 7 shows the pick-up method when it is judged that the second nozzle 9b is a bad nozzle. In this case, the second nozzle 9b is the bad nozzle, and can not be used, and therefore the mounting of the chips is effected using the remaining nozzles, that is, the first and third nozzles 9a and 9c. More specifically, the simultaneous picking-up for the 1st to 3rd mounting operations and the separate picking-up for the 4th mounting operation are effected as scheduled in the program (that is, in the same manner as shown in FIG. 6). Therefore, the chips B, E, E and E, scheduled to be mounted by the second nozzle 9b in the 1st to 4th mounting operations, are not mounted, and therefore these chips B, E, E and E remain in their respective parts feeders.

The 1st to 4th mounting operations are thus effected as scheduled, and thereafter those chips, scheduled to be mounted by the second nozzle 9b, are mounted by the first nozzle 9a and the third nozzle 9c for recovering purposes. More specifically, in a fifth mounting operation, the chip B and the chip E are separately picked up by the first nozzle 9a and the third nozzle 9c, respectively, and are separately mounted on the board 3, and then in a sixth mounting operation, the chip E and the chip E are separately picked up by the first nozzle 9a and the third nozzle 9c, respectively, and are separately mounted on the board 3. In the above method shown in FIG. 7, twelve (12) chips can be picked up to be mounted on the board 3 by a total of nine (9) pick-up operations, that is, 3 simultaneous pick-up operations for the 1st to 3rd mounting operations plus 6 separate pick-up operations for the 4th to 6th mounting operations.

FIG. 8 shows the conventional pick-up method, that is, the pick-up method not employing the method of the invention shown in FIG. 7. In this case, in all of 1st to 6th mounting operations, separate pick-up operations are effected, and therefore a total of 12 pick-up operations are required. Therefore, three more pick-up operations must be effected as compared with the method of FIG. 7, so that the tact-time is increased, thus lowering the mounting efficiency.

In the present invention, when a bad nozzle is produced, the plurality of chips are picked up by the remaining normal nozzles, and are mounted on the board as scheduled, and thereafter those chips scheduled to be mounted by the bad nozzle are mounted by the normal nozzles. Therefore, the increase of the number of the pick-up operations, as well as the increase of the number of reciprocal movement of the transfer head between the parts feeder and the board, is suppressed as much as possible, and the chips can be efficiently mounted on the board while enjoying the advantage of the transfer head having the plurality of the nozzles.

What is claimed is:

1. An electronic parts mounting method comprising the steps of:
   (a) providing a plurality of parts feeders which are juxtaposed at a pitch,
   (b) mounting at least three nozzles on a transfer head at a pitch which is an integral multiple of the pitch of said parts feeders, and
   (c) while employing a moving table to horizontally move said transfer head, simultaneously picking up electronic parts from a plurality of said parts feeders respectively by said nozzles,
   (d) mounting the electronic parts on a board positioned at a positioning portion,
   (e) determining whether any one of said nozzles becomes a bad nozzle,
   (f) stopping the mounting of the electronic parts by said bad nozzle determined in step (e),
   (g) employing at least two normal nozzles of said at least three nozzles to effect, as scheduled in a program, the mounting of the electronic parts based on the stopping recited in step (f), and
   (h) employing said normal nozzles to mount those electronic parts scheduled to be mounted by said bad nozzle.

2. An electronic parts mounting method according to claim 1, wherein step (b) comprises mounting said nozzles in alignment with one another.

3. An electronic parts mounting method according to claim 1, wherein step (c) includes employing an X-Y table as said moving table for horizontally moving said transfer head.

4. An electronic parts mounting apparatus comprising:
   a positioning portion for positioning a board;
   parts feeders juxtaposed at a pitch;
   a transfer head having at least three nozzles mounted thereon at a pitch which is an integral multiple of the pitch of said parts feeders; and
   a moving table for horizontally moving said transfer head, in which electronic parts in a plurality of said parts feeders are picked up simultaneously or separately respectively by said nozzles and are mounted on said board, said apparatus further comprising:
   a pick-up operation storage portion for storing data as to whether the electronic parts are picked up respectively by said plurality of nozzles simultaneously or separately;
   a bad nozzle information storage portion for storing data of said bad nozzle; and
   a control portion for controlling such that if there is any nozzle whose data is stored in said bad nozzle information storage portion, those of said electronic parts scheduled to be mounted by said bad nozzle are mounted by at least two normal nozzles of said at least three nozzles and that the other electronic parts are picked up by said normal nozzles in accordance with the data stored in said pick-up operation storage portion and are mounted on said board.

5. An electronic parts mounting apparatus according to claim 4, wherein said nozzles are aligned with one another.

6. An electronic parts mounting apparatus according to claim 4, wherein said moving table for moving said transfer head in a horizontal direction comprises an X-Y table.

7. An electronic parts mounting method comprising the stops of:
   (a) providing a plurality of parts feeders which are juxtaposed at a predetermined pitch,
   (b) mounting at least three nozzles on a transfer head at a pitch which is an integral multiple of the pitch of said parts feeders,
   (c) while employing a moving table to horizontally move said transfer head, simultaneously picking up electronic parts from a plurality of said parts feeders respectively by said nozzles,
   (d) mounting the electronic parts on a board positioned at a positioning portion,
   (e) determining whether any one of said nozzles becomes a bad nozzle,
   (f) employing at least two normal nozzles of said at least three nozzles to simultaneously pick up a plurality of electronic parts and to mount the electronic parts on the board, and
   (g) employing said normal nozzles to individually pick up and mount electronic parts scheduled to be mounted by said bad nozzle on the board.

8. An electronic parts mounting method according to claim 7, wherein step (b) comprises mounting said nozzles in alignment with one another.

9. An electronic parts mounting method according to claim 7, wherein step (c) includes employing an X-Y table as said moving table for horizontally moving said transfer head.

10. An electronic parts mounting apparatus comprising:

a positioning portion for positioning a board;

parts feeders juxtaposed at a pitch;

a transfer head having at least three nozzles mounted thereon at a pitch which is an integral multiple of the pitch of said parts feeders; and a moving table for moving said transfer head between said parts feeders and said board positioning portion, in which electronic parts in a plurality of said parts feeders are simultaneously picked up respectively by said nozzles and are mounted on said board positioned at the positioning portion, said apparatus further comprising:

a bad nozzle information storage portion for storing data of said bad nozzle; and a control portion for controlling such that if there is any nozzle whose data is stored in said bad nozzle information storage portion, said electronic parts are simultaneously picked up by at least two normal nozzles of said at least three nozzles and mounted on the board and that the electronic parts scheduled to be mounted by said bad nozzle are individually picked up and mounted on the board by said normal nozzles.

11. An electronic parts mounting apparatus according to claim 10, wherein said nozzles are aligned with one another.

12. An electronic parts mounting apparatus according to claim 10, wherein said moving table for moving said transfer head in a horizontal direction comprises an X-Y table.

* * * * *